(12) United States Patent
Lynch et al.

(10) Patent No.: US 7,088,098 B1
(45) Date of Patent: Aug. 8, 2006

(54) SYSTEM, METHOD AND APPARATUS FOR TUNING AN RF VOLUME COIL

(75) Inventors: Daniel T. Lynch, Nashotah, WI (US);
Peter Thomas, Hartland, WI (US);
Deependra Gangakhedkar, Waukesha, WI (US); David Keren, Milwaukee, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/906,551

(22) Filed: Feb. 24, 2005
(Under 37 CFR 1.47)

(51) Int. Cl.
*G01V 3/00* (2006.01)
(52) U.S. Cl. ........................................ 324/307; 324/319
(58) Field of Classification Search ................ 324/318, 324/319, 321, 313, 308, 309, 307, 300, 322
See application file for complete search history.

(56) References Cited

U.S. PATENT DOCUMENTS

| | | | |
|---|---|---|---|
| 5,041,788 A * | 8/1991 | Kontor et al. | 324/318 |
| 5,594,338 A * | 1/1997 | Magnuson | 324/318 |
| 6,456,072 B1 * | 9/2002 | Webb et al. | 324/308 |
| 6,774,634 B1 * | 8/2004 | Cosman | 324/321 |
| 6,812,699 B1 * | 11/2004 | Hoshino | 324/313 |
| 6,822,454 B1 * | 11/2004 | Peck et al. | 324/321 |
| 6,911,822 B1 * | 6/2005 | Augustine et al. | 324/324 |
| 2003/0176781 A1 | 9/2003 | Hoshio | 600/410 |

* cited by examiner

*Primary Examiner*—Brij B. Shrivastav
(74) *Attorney, Agent, or Firm*—Cantor Colburn LLP

(57) ABSTRACT

A method for tuning a radio frequency coil of a magnetic resonance imaging system includes disposing a plurality of probes at selected portions of a fixture, disposing the fixture proximate to the radio frequency coil at a first location, and obtaining a first set of measurements of an output of the radio frequency coil using an automated test equipment.

22 Claims, 5 Drawing Sheets

SYSTEM, METHOD AND APPARATUS FOR TUNING AN RF VOLUME COIL

BACKGROUND OF THE INVENTION

The field of this disclosure relates to magnetic resonance imaging ("MRI") systems. More particularly, the disclosure relates to a system, method and apparatus for minimizing operator intervention during the process of tuning a radio-frequency (RF) coil of an MRI.

MRI is a diagnostic imaging modality that does not rely on ionizing radiation. Instead, it uses strong (ideally) static magnetic fields, RF pulses of energy and magnetic field gradient waveforms. An RF coil produces the RF pulses. MRI is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

When utilizing MRI to produce an image, a technique is employed to obtain MRI signals from specific locations in the subject. Typically, a region that is to be imaged or region of interest (ROI) is scanned by a sequence of MRI measurement cycles, which vary according to the particular localization method being used. The resulting set of received MRI signals are digitized and processed to reconstruct the image using one of many well-known reconstruction techniques. To perform such a scan, it is, of course, necessary to elicit MRI signals from specific locations in the subject. This is accomplished by employing gradient magnetic fields. By controlling the strength of these gradients during each MRI cycle, the spatial distribution of spin excitation can be controlled and the location of the resulting MRI signals can be identified.

An MRI system requires not only an intensive uniform magnetic field generator, but also a suite of associated electronics to operate the MRI system. In order to assure accuracy of images obtained by the MRI system, a typical MRI system requires tuning of the RF coil prior to use. RF coil tuning often requires operator intervention to ensure proper tuning between scans. Operator intervention increases the time of the tuning process and may introduce errors into subsequent measurements made by an improperly tuned RF coil. Additionally, insertion of metallic objects into the RF coil often distorts measurements, which can invalidate the RF coil tuning. Thus, it is desirable to develop a method and apparatus capable of acquiring RF measurements without introducing the drawbacks described above.

BRIEF DESCRIPTION OF THE INVENTION

Exemplary embodiments of the invention include a method for tuning a radio frequency coil of a magnetic resonance imaging system. The method includes disposing a plurality of probes at selected portions of a fixture, disposing the fixture proximate to the radio frequency coil at a first location, and obtaining a first set of measurements of an output of the radio frequency coil using an automated test equipment.

Further exemplary embodiments of the invention include a system for tuning a radio frequency coil of an imaging system having a bore for inserting an object. The system includes an automated test equipment and a probe assembly. The automated test equipment is configured to measure an output of the radio frequency coil to allow the tuning of the radio frequency coil. The probe assembly is in electrical communication with the automated test equipment. The probe assembly includes a plurality of probes configured to receive the output of the radio frequency coil and translate the output to the automated test equipment.

Still further exemplary embodiments of the invention include a probe assembly adapted to connecting with an automated test equipment for tuning a radio frequency coil of an imaging system having a bore for inserting an object. The probe assembly includes a probe fixture, a rotator and a cart. The probe fixture having a first end, a second end and a middle portion. The probe fixture including a fixture body, a plurality of probes and a plurality of connecting cables. The fixture body is adapted to inserting within the bore. The plurality of probes is fixed with respect to the fixture body. Each probe is disposed at an interval from each other probe around a circumference of the first end of the probe fixture. Each of the probes is disposed such as to be arranged substantially parallel to an axis of the radio frequency coil. The rotator is mechanically connected to the second end and configured to enable rotation of the probe fixture. The cart is mechanically connected to the rotator. Each connecting cable is electrically connected to a corresponding one of the plurality of probes.

Yet further exemplary embodiments of the invention include a computer program product for tuning a radio frequency coil of an imaging system. The product includes a storage medium. The storage medium is readable by a processing circuit and stores instructions for execution by the processing circuit for obtaining a first set and a second set of measurements of an output of the radio frequency coil using an automated test equipment. The first and second sets of measurements are measured using a plurality of probes disposed at an interval around the circumference of a fixture disposed proximate to the radio frequency coil.

The above, and other objects, features and advantages of the present invention will become apparent from the following description read in conjunction with the accompanying drawings, in which like reference numerals designate the same elements.

BRIEF DESCRIPTION OF THE DRAWINGS

Referring now to the drawings wherein like elements are numbered alike in the several FIGURES.

DETAILED DESCRIPTION OF THE INVENTION

Figure 1:
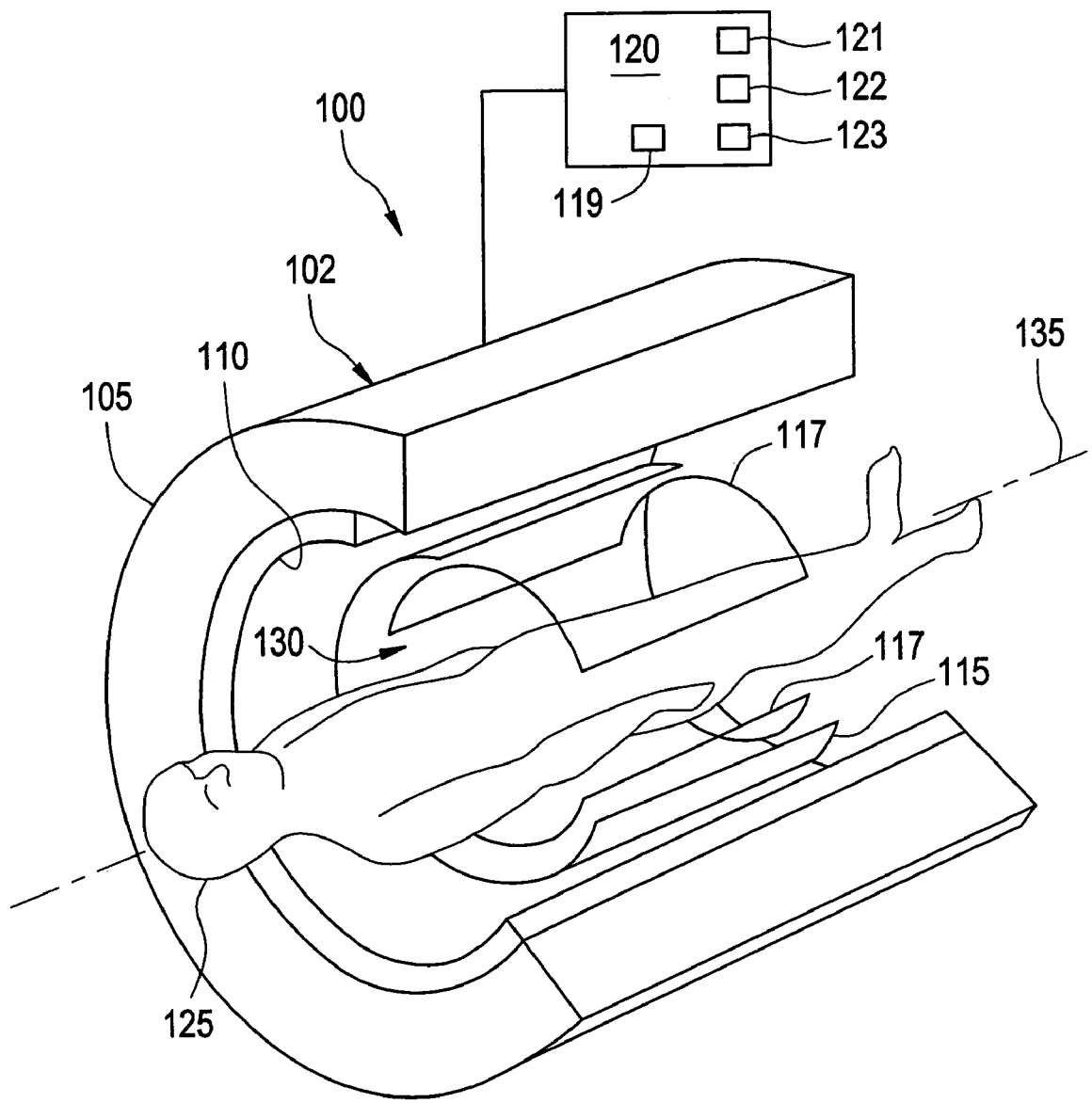
FIG. 1 depicts an exemplary embodiment of an MRI system.

FIG. 1 depicts an exemplary embodiment of an MRI system 100 having a magnetic field generating apparatus 102 and a control system 120 for the control and operation thereof. An exemplary apparatus 102, shown having a portion cutaway to show structure within apparatus 102, includes an annular magnetic field generator 105, X-Y-Z gradient coils 110 disposed within field generator 105 for spatial encoding of the magnetic field within an imaging volume inside a bore 130, an RF coil 117 for generating a pulsed RF magnetic $B_1$ field, and an optional RF shield 115 disposed between RF coil 117 and gradient coil 110 for providing RF shielding. A person 125 or other imaging object is placed within bore 130 of field generating apparatus 102 and subjected to MRI diagnostics under the control of control system 120. In an embodiment, control system 120 includes x, y and z-axis gradient magnetic field power supplies 121 for powering field generating apparatus 102, an RF coil amplifier 119, transmit and receive circuitry 122 for controlling the RF pulses to gradient coil 110, and a computer system 123 for overall control and for processing and displaying the nuclear magnetic resonance signals.

Tuning of the RF coil 117 may be accomplished by the insertion of a probe assembly into the bore 130. A typical probe assembly requires an operator to manually position a pair of loops inside the RF coil 117, make a measurement and then manually reposition the pair of loops inside the RF coil 117 to measure the frequency at a spatially different location. To eliminate a need for this positioning and repositioning a probe fixture 200 (see FIG. 2) is designed with a plurality of probes 210 spatially disposed at intervals. Insertion of the probe fixture 200 into the bore 130 for tuning, however, may cause a loading of the RF coil 117 and prevent a proper tuning of the RF coil 117. Thus, care must be taken to ensure that the design of the probe fixture 200 is such that the probe fixture 200 is capable of measuring all natural (quadrature) mode frequencies of the RF coil 117, while not interfering with the natural mode frequencies and Q of the RF coil 117.

Figure 2:
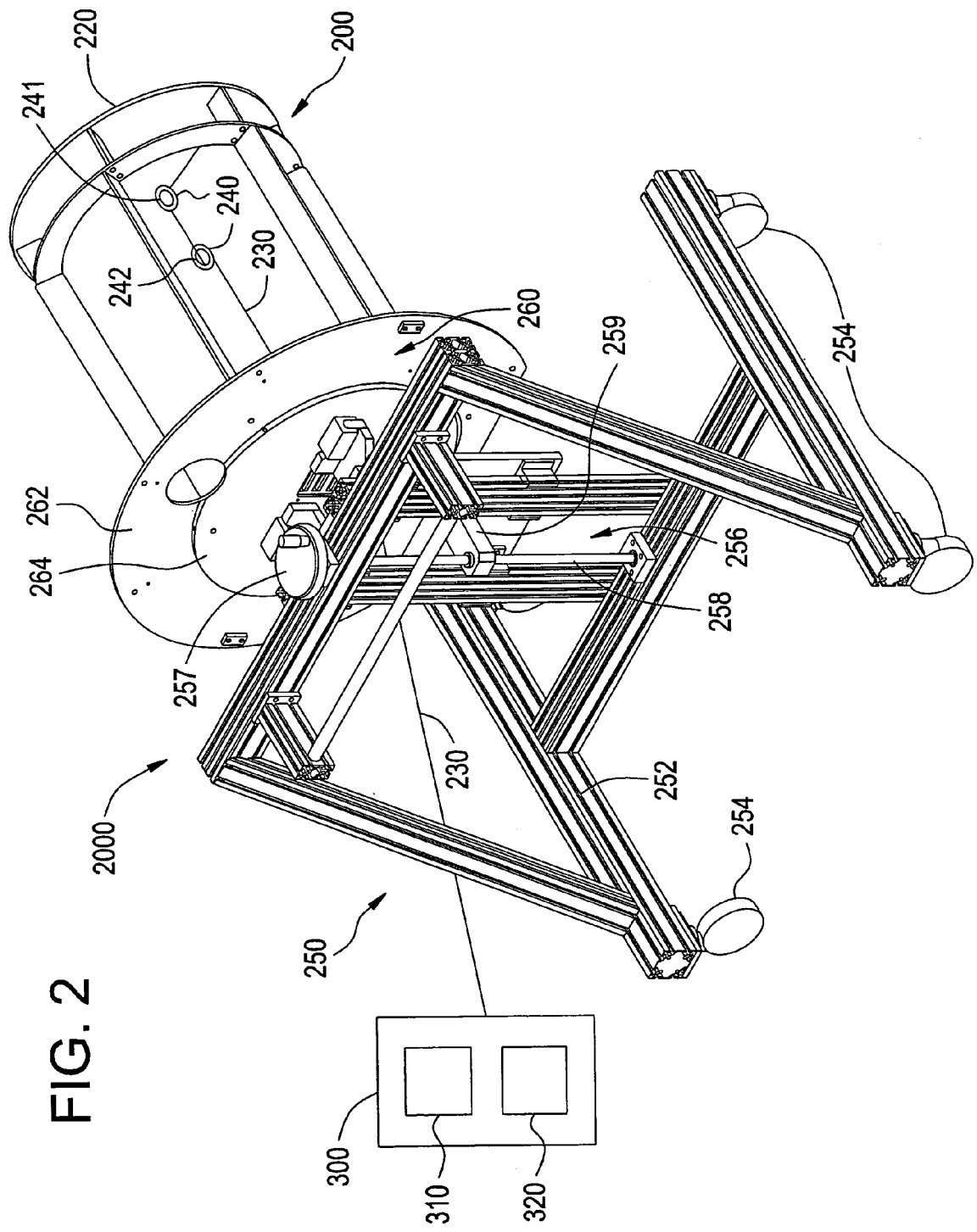
FIG. 2 depicts a perspective view of a probe assembly for tuning the MRI system of FIG. 1 according to an exemplary embodiment.
Figure 3:
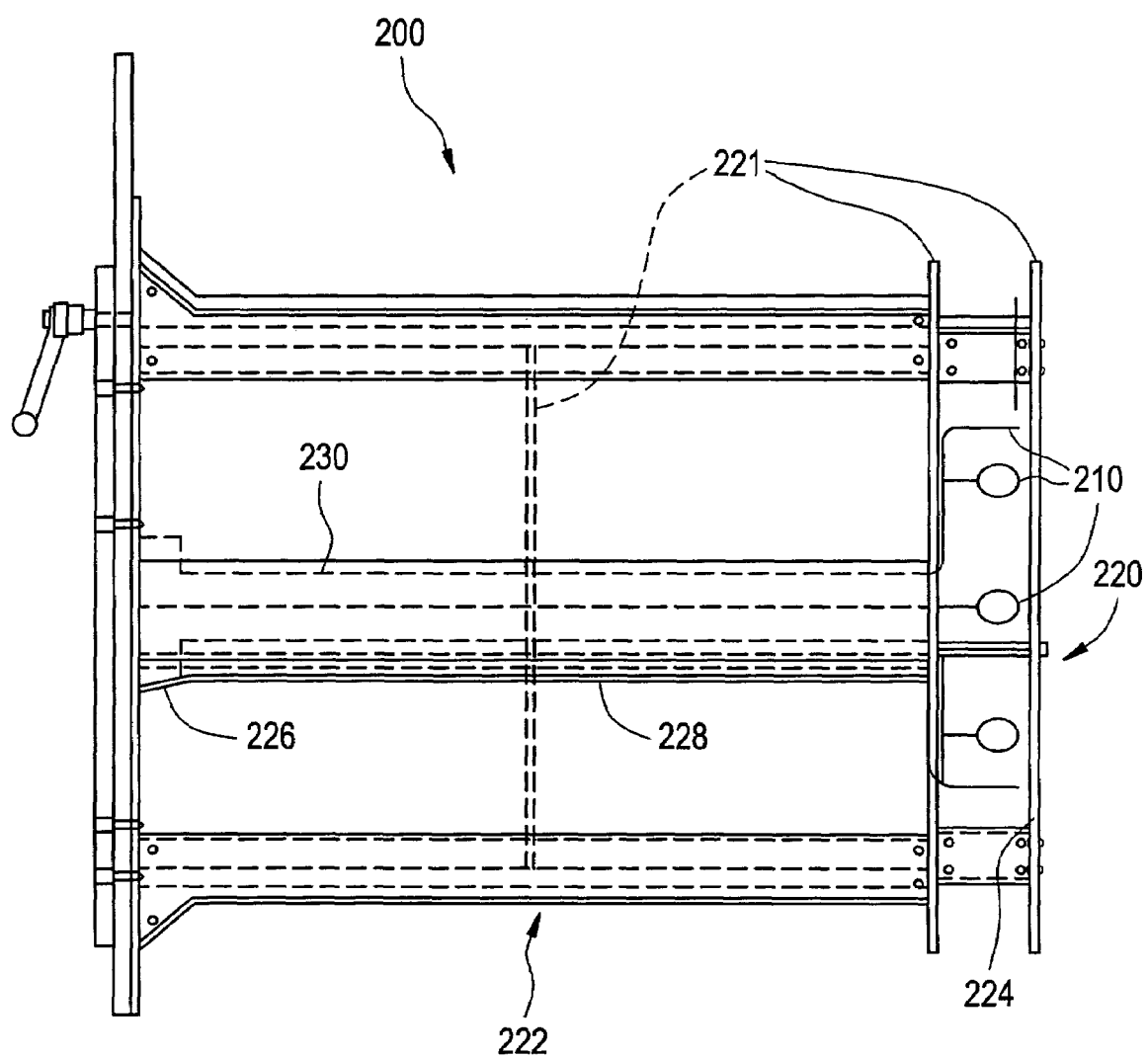
FIG. 3 depicts a side view of a probe fixture for the probe assembly of FIG. 2.

FIG. 2 shows a probe assembly 2000 according to an exemplary embodiment of the present invention. The probe assembly 2000 includes the probe fixture 200, a cart 250, and a rotator 260. FIG. 3 is a side view of a probe fixture for the probe assembly of FIG. 2.

Referring to FIGS. 1, 2, and 3, the probe fixture 200 includes a plurality of probes 210, a fixture body 220, and connecting cables 230. When inserted into the bore 130 of the MRI system 100, the probe fixture 200 is an accessory for tuning the RF coil 117 in conjunction with automated test equipment (ATE) 300. The ATE 300 is a system containing electronic circuitry capable of testing and tuning the RF coil 117. The probe assembly 2000 is a tool for use in conjunction with the ATE 300 to test and tune the RF coil 117. The ATE 300 of an exemplary embodiment includes a storage medium 310 and a processing circuit 320. The ATE 300 may include a computer program code containing instructions embodied in tangible media, such as floppy diskettes, CD-ROMs, hard drives, or any other computer readable storage medium, wherein, when the computer program code is loaded into and executed by a computer, the computer becomes an apparatus for practicing the invention. The present invention may also be embodied in the form of computer program code, for example, whether stored in a storage medium 310, loaded into and/or executed by a computer, or transmitted over some transmission medium, such as over electrical wiring or cabling, through fiber optics, or via electromagnetic radiation, wherein when the computer program code is loaded into and executed by a computer 310, the computer becomes an apparatus for practicing the invention. When implemented on a general-purpose microprocessor, the computer program code segments configure the microprocessor to create specific logic circuits. The technical effect of the executable instructions is to obtain a first set of measurements to tune the RF coil 117.

Additionally, the executable instructions may include instructions to obtain a second set of measurements to tune the RF coil 117.

The fixture body 220 is made of material that is non-magnetic to prevent an affect on measurements (in terms of loading the coil and shifting frequency). In an exemplary embodiment, the fixture body 220 is made of a polycarbonate resin and polyvinyl chloride for the strength required to keep the structural integrity of the cylinder housing the plurality of probes 210. The fixture body 220 is substantially cylindrical in shape and is adapted to fit inside the bore 130. In an exemplary embodiment, the fixture body 220 includes three plate shaped members 221 that are spaced apart and supported by support members 222. The support members 222 extend along a longitudinal direction of the probe fixture 200 and connect to each of the three plate shaped members. The fixture body 220 has a first end 224, a second end 226, and a middle portion 228. The first end 224, the second end 226 and the middle portion 228 of the fixture body 220 correspond to a first end, a second end and a middle portion of the probe fixture 200, respectively. In the present embodiment, one of the three plate shaped members 221 is disposed at middle portion 228, and the remaining two of the three plate shaped members 221 are disposed spaced apart from each other at the first end 224. The diameter of the fixture body 220 is large enough to place the plurality of probes 210 near the RF coil 117 and small enough to allow the probe fixture 200 to fit within the bore 130.

The plurality of probes 210 each include a single loop made of about 0.141 inch (or about 0.358 cm) semi-rigid cable. In an exemplary embodiment, the plurality of probes 210 comprise 8 probes 210 disposed between the remaining two of the three plate shaped members 221 at the first end 224 the two plate shaped at 45° intervals around the circumference of the probe fixture 200. In this exemplary embodiment, the 8 probes 210 are disposed around the circumference of the probe fixture 200 in a circle having a diameter of about 28 cm. Each of the 8 probes 210 also includes a short stem of about 2.5 cm. The diameter of the single loop of each of the 8 probes 210 is about 7.6 cm. Each of the 8 probes is disposed such that a plane passing through a particular probe 210 of the 8 probes 210 is substantially parallel to an interior surface of the bore 130 corresponding to the particular probe 210. The diameter of the single loop of each of the 8 probes 210 of about 7.6 cm is advantageous for detecting the RF coil 117 frequency using an $S_{21}$ measurement.

Connecting cables 230 are used to connect each of the 8 probes 210 to the ATE 300 outside of the probe assembly 2000. The connecting cables are disposed such that a corresponding connecting cable 230 extends from each of the 8 probes radially toward the center of the fixture body 220 and then extends down a center portion the fixture body 220 from the first end 224 to the second end 226 to ensure that the connecting cables 230 do not contact the RF coil 117 and thus load the RF coil 117 introducing errors into frequency measurements.

To prevent the connecting cables 230 from having a common mode voltage on shields of the connecting cables 230, the connecting cables 230 are routed through toroids 240, which are disposed at selected portions of the connecting cables 230 between the ATE 300 and the 8 probes 210. The connecting cables 230 loop around the toroids 240 to maximize an impedance of the shields of the connecting cables 230 to the common mode voltage. In an exemplary embodiment, the toroids 240 have a diameter of about 5 cm and each connecting cable 230 makes 4½ loops around each of the toroids 240. Additionally, there may be two toroids 240 disposed along each of the connecting cables 230 of the 8 probes 210. A first toroid 241 is disposed at a portion of the connecting cables 230 at the first end 224 of the fixture body 220, near a corresponding one of the 8 probes 210. A second toroid 242 is disposed at a portion of the connecting cables 230 inside the fixture body 220 near the middle portion 228.

Figure 4:
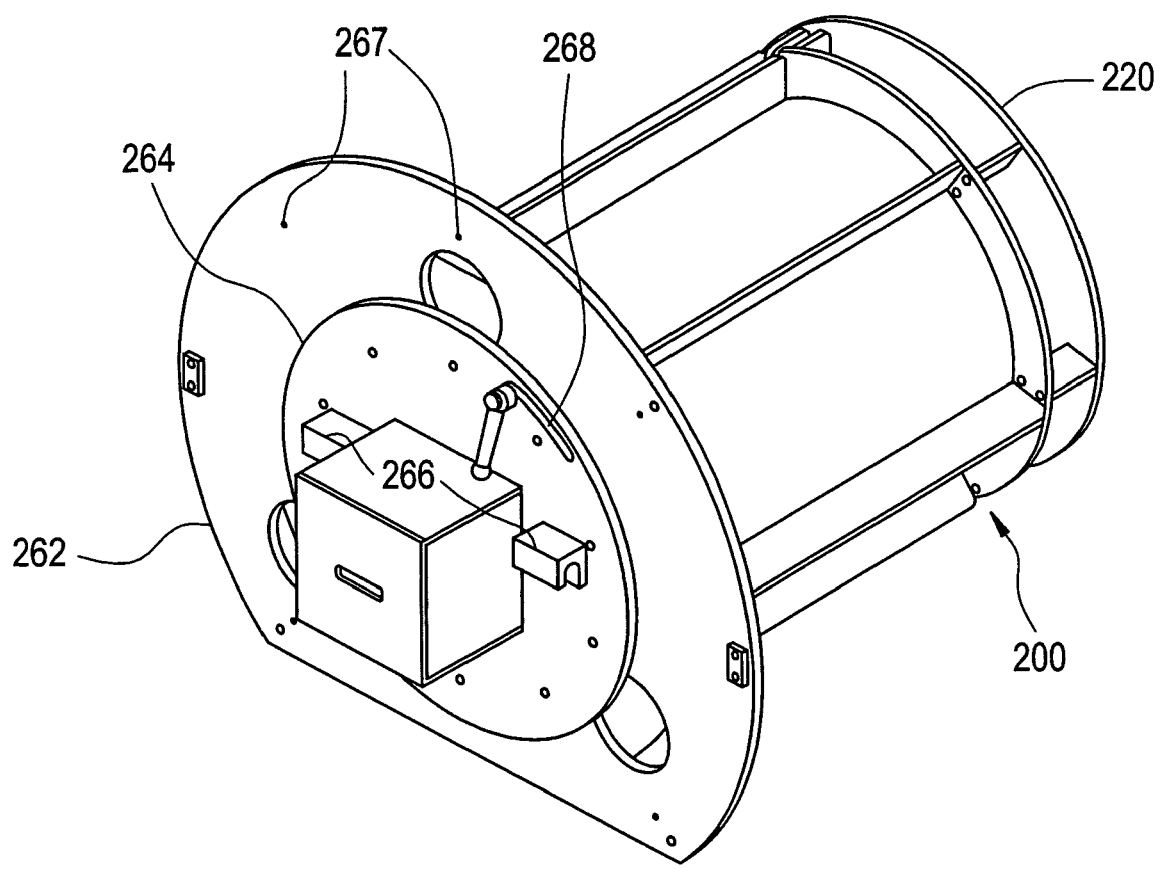
FIG. 4 depicts a perspective view of a rotator for the probe assembly of FIG. 2.

FIG. 4 depicts a perspective view of a rotator for the probe assembly of FIG. 2. Referring to FIGS. 1, 2 and 4, the probe fixture 200 may be made moveable when combined with the cart 250 and the rotator 260 to form the probe assembly 2000. The cart 250 supports the probe fixture 200 via the rotator 260. The cart 250 acts as a movement assembly, which allows the probe fixture 200 to be inserted into the bore 130 and withdrawn from the bore 130 as necessary for tuning the RF coil 117. The cart 250 includes a frame 252, a movement assembly 254, and a lift assembly 256. The frame 252 is mechanically connected to the fixture body 220 via the rotator 260 and supports the probe fixture 200 during transporting of the probe assembly 2000. The movement assembly 254 provides a mechanism for transporting the probe fixture 200. Although in an exemplary embodiment, the movement assembly 254 includes wheels, it is envisioned that the movement assembly 254 may include any suitable method of moving the probe fixture 200 including but not limited to tracks, bearings, slides, belts, pulleys, rollers, etc. The lift assembly 256 includes a hand wheel 257, a lifting shaft 258, and a holding mechanism 259. The holding mechanism 259 provides a means to for the cart 250 to support the rotator 260. The holding mechanism 259 is mechanically connected to the lifting shaft 258 and moves with the lifting shaft 258 to raise or lower an elevation of the probe fixture 200 to allow insertion of the probe fixture 200 into the bore 130. The lifting shaft 258 extends in a direction substantially normal to a surface on which the cart 250 rests. The lifting shaft 258 elevates the holding mechanism 259 in response to an input from the hand wheel 257. The hand wheel 257 is rotatably attached to the lifting shaft to control a rotation of the lifting shaft 258.

The probe assembly 2000 also includes the rotator 260 to mechanically connect the probe fixture 200 to the cart 250. The rotator 260 also enables a rotation of the probe fixture 200 within the bore 130 to allow double the number of measurements to be taken by rotating the entire probe fixture 200 through 22.5°. The rotator 260 includes a base plate 262, a rotation plate 264 and a hanger assembly 266. The base plate 262 is mechanically connected to the rotation plate 264 such that the rotation plate 264 is capable of rotating relative to the base plate 262. The base plate includes bolt holes 267 which allow the base plate to be affixed to an exterior face (not shown) of the MRI 100. When the base plate 262 is affixed to the exterior face of the MRI 100, the base plate supports the probe fixture 200 in a contact free manner with respect to the RF coil 117 via the rotation plate 264. The rotation plate 264 is affixed to the second end 226 of the fixture body 220. Thus, when the rotation plate 264 is rotated with respect to the base plate 262, the fixture body 220 rotates with respect to the RF coil 117. The rotation plate 264 includes a mechanical slide 268 with a degree of freedom of 22.5°. Thus, to rotate the fixture body 220, the rotation plate 264 is rotated via the mechanical slide 268 causing the base plate 262 to rotate 22.5° from a first position to a second position. Thus, if necessary, the operator may take a first set of measurements (the measurements themselves being controlled through a computer program) at a first position and then rotate the fixture body 220 22.5° to a second position using the mechanical slide 268 and take a second set of measurements at the second position being different 22.5° from the first position.

Figure 5:
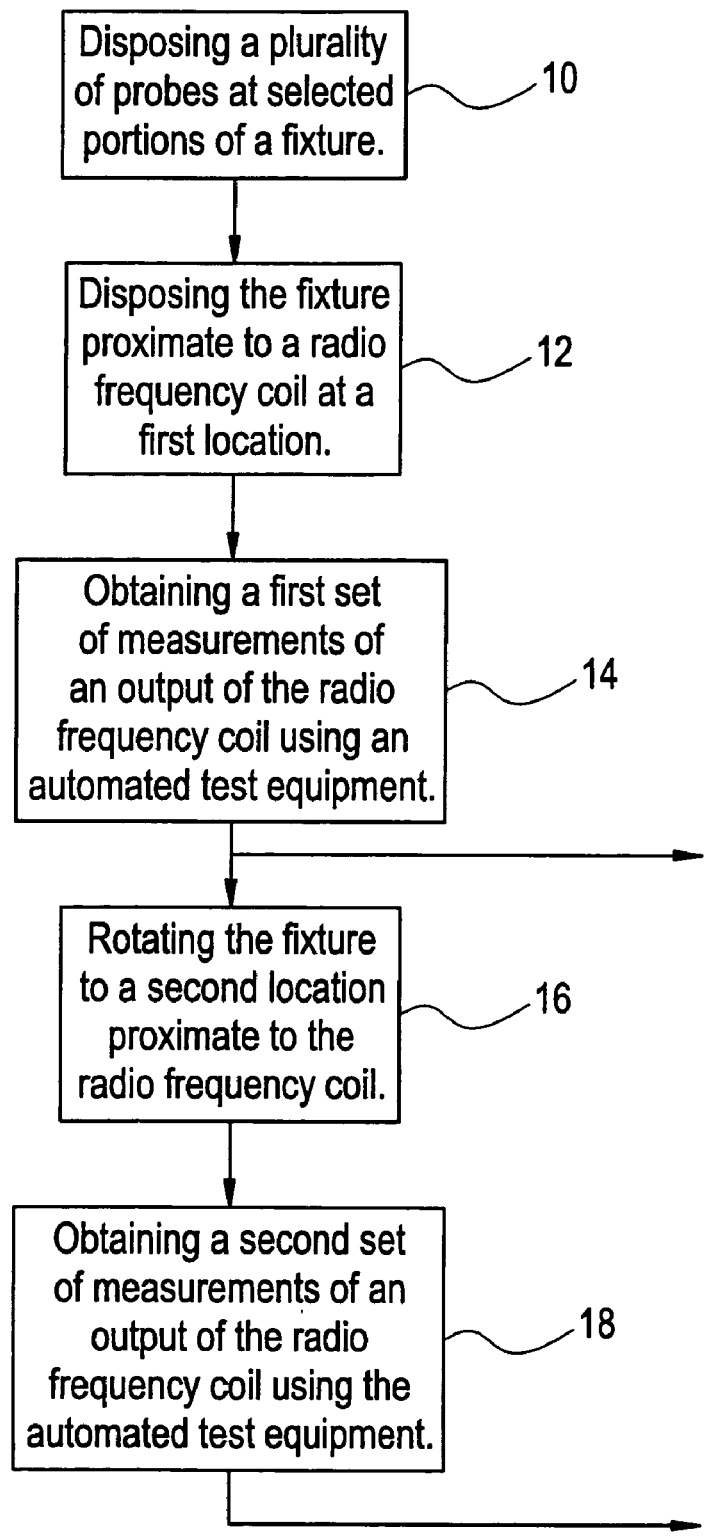
FIG. 5 is a block diagram illustrating a method for tuning a radio frequency coil of a magnetic resonance imaging system according to an exemplary embodiment.

FIG. 5 is a block diagram illustrating a method for tuning a radio frequency coil of a magnetic resonance imaging system. The method includes disposing a plurality of probes at selected portions of a fixture at step 10, disposing the fixture proximate to a radio frequency coil at a first location at step 12, and obtaining a first set of measurements of an output of the radio frequency coil using an automated test equipment at step 14. In an exemplary embodiment, the method further includes rotating the fixture to a second location proximate to the radio frequency coil at step 16 and obtaining a second set of measurements of the output of the radio frequency coil using the automated test equipment at step 18. In an exemplary embodiment, 8 probes are disposed at 45° intervals around a circumference of the fixture, and the second set of measurements is obtained after rotating the fixture 22.5°.

Thus, the probe assembly 2000 allows a reduction in tuning time of the RF coil 117 and removes a potential for operator error in adjusting probes. Additionally, the structure of the probe fixture 200 is such that the probe assembly 2000 is adapted to accurately measuring RF coil 117 frequency without loading the RF coil 117.

In addition, while the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for tuning a radio frequency coil of a magnetic resonance imaging system, the radio frequency coil comprising a bore, the method comprising:

disposing a plurality of probes at selected portions on a fixture, the fixture being separate and independent of the radio frequency coil;

removably disposing the fixture proximate to the radio frequency coil at a first location within the bore of the radio frequency coil; and obtaining a first set of measurements of an output of the radio frequency coil using an automated test equipment;

wherein the first set of measurements are taken to tune the radio frequency coil.

2. The method of claim 1, further comprising:

rotating the fixture to a second location proximate to the radio frequency coil; and obtaining a second set of measurements of the output of the radio frequency coil using the automated test equipment.

3. The method of claim 2, wherein disposing the plurality of probes comprises disposing 8 probes around the circumference of the fixture, the 8 probes having a selected interval between each other.

4. The method of claim 3, wherein disposing a probes further comprises disposing each of the 8 probes having 45 degrees between each other of the 8 probes.

5. The method of claim 2, wherein rotating the fixture comprises rotating the fixture 22.5 degrees.

6. The method of claim 1, further comprising:
 transporting the fixture proximate to the magnetic resonance imaging system via a cart, the cart comprising a lift assembly;
 wherein the removably disposing the fixture further comprises removably disposing the fixture via the lift assembly.

7. The method of claim 1, wherein the disposing a plurality of probes further comprises:
 disposing a plurality of probes at an interval from each other around a circumference of a first end of the fixture.

8. A system for tuning a radio frequency coil of an imaging system having a bore for inserting an object, the system including:
 an automated test equipment configured to measure an output of the radio frequency coil to allow the tuning of the radio frequency coil; and
 a probe assembly in electrical communication with the automated test equipment, the probe assembly including a plurality of probes configured to receive the output of the radio frequency coil and translate the output to the automated test equipment;
 wherein the probe assembly is separate and independent of the radio frequency coil; and
 wherein the plurality of probes are configured to be removably disposed within the bore.

9. The system of claim 8, wherein the plurality of probes comprises 8 probes disposed at an interval of 45 degrees between each of the 8 probes.

10. The system of claim 9, wherein the probe assembly is configured to rotate 22.5 degrees.

11. The system of claim 8, wherein the probe assembly comprises non-magnetic material.

12. A probe assembly adapted to connecting with an automated test equipment for tuning a radio frequency coil of an imaging system having a bore for inserting an object, the probe assembly comprising:
 a probe fixture having a first end, a second end and a middle portion;
 a rotator mechanically connected to the second end and configured to enable rotation of the probe fixture; and
 a cart mechanically connected to the rotator, wherein the probe fixture comprises:
  a fixture body adapted to inserting within the bore;
  a plurality of probes fixed with respect to the fixture body, each probe being disposed at an interval from each other probe around a circumference of the first end of the probe fixture, each of the probes being disposed such as to be arranged substantially parallel to an axis of the radio frequency coil; and
  a plurality of connecting cables, each connecting cable being electrically connected to a corresponding one of the plurality of probes.

13. The probe assembly of claim 12, wherein the rotator comprises:
 a base plate;
 a rotation plate rotatably connected to the base plate and affixed to the probe fixture; and
 a hanger assembly mechanically connected to the rotation plate to provide attachment of the rotator to the cart.

14. The probe assembly of claim 13, wherein the base plate is adapted to be affixed to a portion of the imaging system to maintain the probe fixture in a contact free relationship relative to the radio frequency coil.

15. The probe assembly of claim 13 wherein the rotation plate comprises a mechanical slide configured to rotate the fixture body about 22.5 degrees with respect to the radio frequency coil.

16. The probe assembly of claim 12, wherein the cart comprises:
 a frame;
 a lifting assembly mechanically connected to the frame and the rotator to pert adjustment of an elevation of the probe fixture to allow insertion of the probe fixture into the bore; and
 a movement assembly mechanically connected to the frame to enable movement of the probe fixture.

17. The probe assembly of claim 12, wherein the plurality of probes comprises 8 probes and the interval is 45 degrees between each of the 8 probes.

18. The probe assembly of claim 12, wherein each of the probes comprises a loop of cable, the loop of cable having a diameter of about 7.6 cm.

19. The probe assembly of claim 12, further comprising a plurality of toroids, each of the toroids having one of the plurality of connecting cables routed through each of the toroids, at least one toroid of the plurality of toroids corresponding to each of the probes, the plurality of toroids comprise a first toroid disposed at the first end of the probe fixture and a second toroid disposed at the middle portion of the probe fixture corresponding to each of the probes.

20. The probe assembly of claim 18, wherein the fixture body comprises non-magnetic material and has a substantially cylindrical shape.

21. A computer program product for tuning a radio frequency coil of an imaging system, the product comprising:
 a storage medium, readable by a processing circuit, storing instructions for execution by the processing circuit for:
  obtaining a first set of measurements of an output of the radio frequency coil using an automated test equipment; and
  obtaining a second set of measurements of the output of the radio frequency coil using the automated test equipment, wherein the first and second sets of measurements are measured us a plurality of probes disposed at an interval around the circumference of a fixture disposed proximate to the radio frequency coil.

22. The product of claim 21, where the fixture is rotated between obtaining the first and second sets of measurements.

* * * * *

UNITED STATES PATENT AND TRADEMARK OFFICE
CERTIFICATE OF CORRECTION

| | | |
|---|---|---|
| PATENT NO. | : 7,088,098 B1 | Page 1 of 1 |
| APPLICATION NO. | : 10/906551 | |
| DATED | : August 8, 2006 | |
| INVENTOR(S) | : Daniel T. Lynch et al. | |

It is certified that error appears in the above-identified patent and that said Letters Patent is hereby corrected as shown below:

Title Page:
Item (56) References Cited, after "2003/0176781 A1 9/2003", delete "Hoshio" and insert therefor --Hoshino--;

Column 7:
Line 5, after "disposing", delete "a" and insert therefor --8--;

Column 8:
Line 20, after "to", delete "pert" and insert therefor --permit--;
Line 54, after "measured", delete "us" and insert therefor --using--.

Signed and Sealed this

Seventeenth Day of July, 2007

JON W. DUDAS
*Director of the United States Patent and Trademark Office*